United States Patent [19]
Saitou

[11] Patent Number: 6,137,147
[45] Date of Patent: Oct. 24, 2000

[54] BIPOLAR TRANSISTOR AND SEMICONDUCTOR INTEGRATED CIRCUIT DEVICE

[75] Inventor: Naoto Saitou, Chiba, Japan

[73] Assignee: Seiko Instruments Inc., Japan

[21] Appl. No.: 09/253,503

[22] Filed: Feb. 19, 1999

[30] Foreign Application Priority Data

Feb. 20, 1998 [JP] Japan ................... 10-039409
May 27, 1998 [JP] Japan ................... 10-146241

[51] Int. Cl.[7] .................................................. H01C 29/76
[52] U.S. Cl. .................... 257/378; 257/370; 257/378; 438/202; 438/203
[58] Field of Search .................... 257/370, 378; 438/202, 203

[56] References Cited

U.S. PATENT DOCUMENTS

| | | | |
|---|---|---|---|
| 5,169,794 | 12/1992 | Iranmanesh | 257/370 |
| 5,439,833 | 8/1995 | Hebert et al. | 257/370 |
| 5,504,364 | 4/1996 | Chang et al. | 257/370 |
| 5,731,617 | 3/1998 | Suda | 257/370 |
| 5,736,776 | 4/1998 | Yamamoto et al. | 257/532 |
| 5,780,329 | 7/1998 | Randazzo et al. | 438/202 |
| 5,856,218 | 1/1999 | Kinoshita et al. | 438/202 |
| 5,886,387 | 3/1999 | Nishigori et al. | 257/370 |
| 5,917,222 | 6/1999 | Smayling et al. | 257/370 |

*Primary Examiner*—David Hardy
*Assistant Examiner*—Edgardo Ortiz
*Attorney, Agent, or Firm*—Adams & Wilks

[57] ABSTRACT

A bipolar transistor has a semiconductor region of a first conductivity type. A collector region of the first conductivity type and a base region of a second conductivity type are disposed within the semiconductor region. An emitter region of the first conductivity type and a base electrode region of the second conductivity type are disposed within a surface of the base region in self-alignment arrangement. At least one polycrystalline silicon layer is disposed on the entire surface of the base region except for portions of the surface of the base region overlying the emitter region and the base electrode region.

15 Claims, 6 Drawing Sheets

BIPOLAR TRANSISTOR AND SEMICONDUCTOR INTEGRATED CIRCUIT DEVICE

BACKGROUND OF THE INVENTION

This invention relates to the structure of a bipolar type semiconductor device and a semiconductor integrated circuit device each having bipolar type and MIS type semiconductor devices as formed on the same substrate, and also relates to arrangements of semiconductor integrated circuit devices including a semiconductor integrated circuit device for use as a power supply having a constant voltage output function and a constant current output function.

Prior known bipolar type semiconductor devices are such that only a relatively thin oxide film is on the base region thereof while letting an interlayer insulating film and passivation film reside on the oxide film, which would result in occurrence of various influences onto the base region surface, which in turn can badly behave to enlarge variations in characteristics of such bipolar transistors and/or cause a change of the characteristics with time. In addition, since the base electrode region and emitter region are determinable by the oxide film's etching process and also position-determined by separate alignment procedures independent of each other, the resulting alignment steps increase in number thereby increasing an error in position alignment. Alternatively, the oxide film etching can sometimes result in an energy level or the like taking place in the interface between silicon and silicon oxide films of an emitter junction, which would reduce or degrade the characteristics. Furthermore, the currently available self-alignment technologies as widely employed until today are extremely complicated both in structure and in process increasing the number of process steps, which lengthens a time taken for effectuation of such processes required.

FIG. 2 is a diagram showing a cross-sectional view of a prior known bipolar transistor without having any polycrystalline silicon layer disposed on the surface of a base region so that the transistor is not self-aligned. An emitter region 32 and a base electrode 31 are not formed so that these are self-aligned with each other.

As has been described above, it has been revealed that in the bipolar type semiconductor devices, a fine or delicate change in structure and process in regard to the base region can significantly affect the resultant device characteristics. In addition, it remains impossible to easily reduce deviation in positional distance of respective impurity regions, which has served as the cause for deviation of $h_{FE}$, breakdown voltage, frequency characteristics and the like—these are major properties of bipolar transistors—as well as threshold voltage thereof. This in turn makes it impossible to manufacture those devices of good characteristics by use of easy processes.

It is therefore an object of this invention to avoid the problems encountered with the prior art by providing a device of less deviation capable of manufacture by simple and low-cost processes.

SUMMARY OF THE INVENTION

To attain the foregoing object the present invention employs specific means which follow.

A first means is to make use of a patterned polycrystalline silicon layer as a mask to effectuate introduction of impurities thereby enabling formation of respective regions in a self-alignment manner.

A second means is that a polycrystalline silicon layer is formed covering an underlying base region to thereby establish the stability of such base region.

A third means is that the polycrystalline silicon for use as the mask during impurity introduction is specifically configured so that it is common with the gate electrode of an insulated field effect transistor.

A fourth means is that the polycrystalline silicon covering the base region is connected to a base metal electrode via a contact hole which is common with that for the base electrode region.

A fifth means is that the process arrangement is designed so that it requires no extra process steps to be added to the processes in the prior art.

DETAILED DESCRIPTION OF THE PREFERRED EMBODIMENTS

Figure 1A:
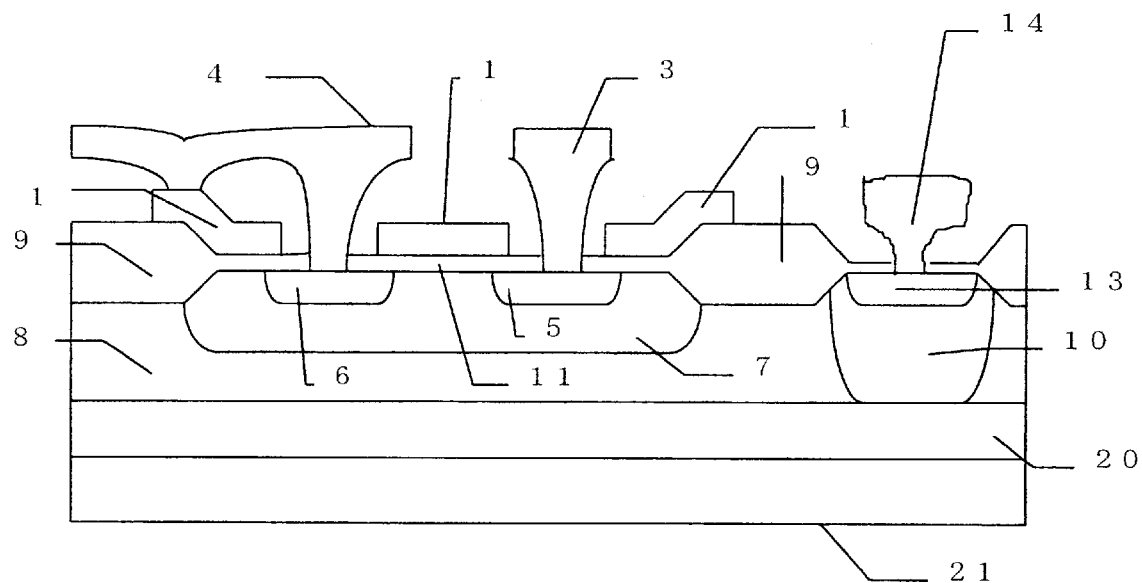
FIG. 1A is a cross-sectional diagram of a bipolar transistor in accordance with the present invention.

Some preferred embodiments of the present invention will be explained with reference to the accompanying drawings. In the drawings a variety of layers depicted with visual emphasis therein are not to scale in thickness for purposes of illustration only.

FIG. 1A is a diagram showing a sectional view of a bipolar transistor in accordance with a first embodiment.

A structure of this bipolar transistor will be explained below. A buried layer 20 and epi-growth Si layer 8 are formed on a P-type silicon substrate 21. A field oxide film 9 of a thick insulating film and a relatively thin silicon oxide film 11 are on the surface of the epi-growth Si layer 8. A base region 7 and base electrode region 6 as well as emitter region 5 are formed underlying the silicon oxide film 11 while a first polycrystalline silicon layer 1 for use as a mask during the process of impurity introduction is disposed overlying the silicon oxide film 11 except for those regions above the base electrode region 6 and emitter region 5.

Figure 1B:
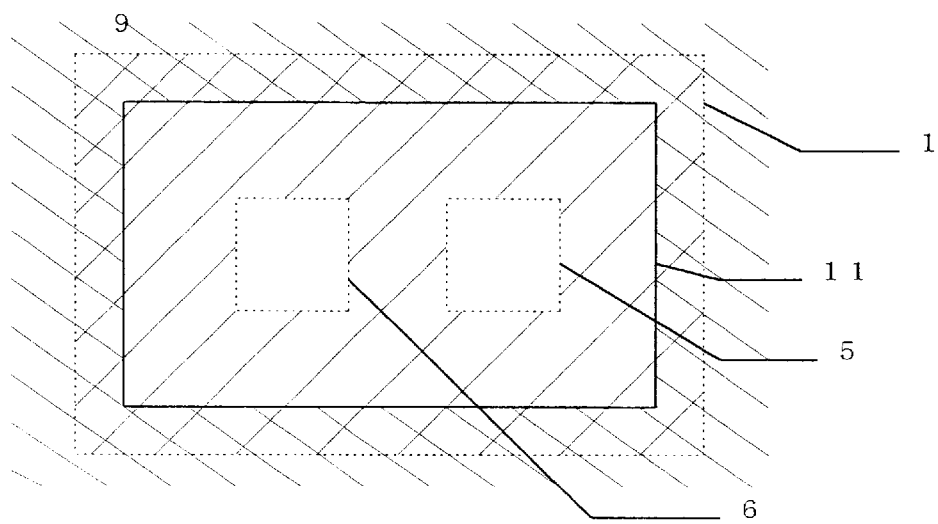
FIG. 1B depicts a plan view of the bipolar transistor of the present invention.
Figure 2:
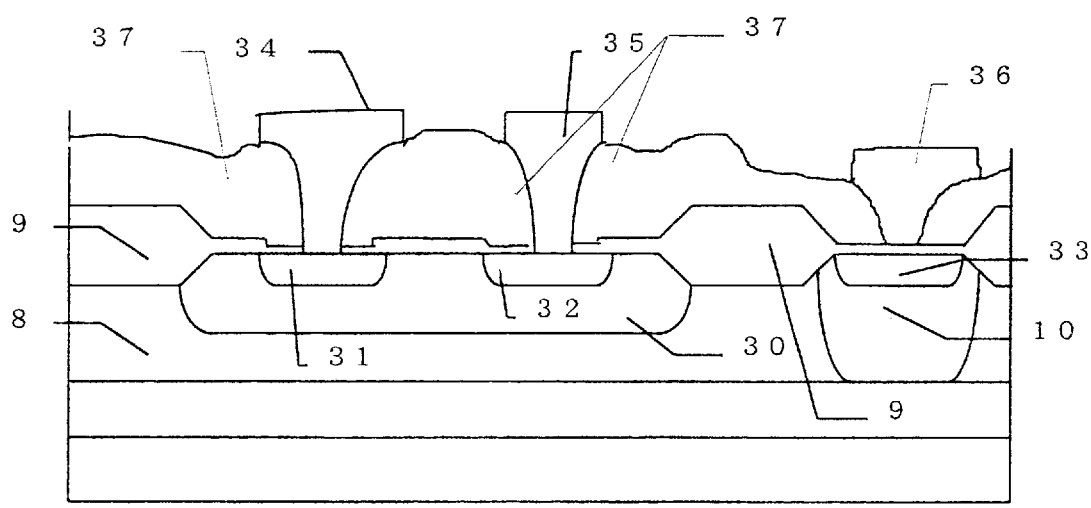
FIG. 2 is a sectional diagram of a bipolar transistor in the prior art.

FIG. 1B is a diagram showing a plan view of the bipolar transistor of the first embodiment. The first polycrystalline silicon layer 1 covers almost the entire base region excluding those portions overlying the emitter region 5 and base electrode region 6, part of which overlaps the field oxide film 9. It is noted that in FIG. 1B any components other than the first polycrystalline silicon layer 1, emitter region 5, base electrode 6, field oxide film 9 and silicon oxide film 11 are omitted from the illustration.

FIG. 3 is a process-sequential cross-sectional diagram showing a manufacturing method of a vertical type bipolar transistor in accordance with the first embodiment shown in FIG. 1A. As shown in FIG. 3A, the buried layer 20 and epi-growth Si layer 8 are formed on the P-type substrate 21. Also formed on this wafer at earlier process steps are a thin oxide film 2 and a field oxide film 9 as well as a collector wall 10. The film thickness of the thin oxide film 2 is approximately 10 nm to 100 nm. More preferably, it ranges from 50 nm to 100 nm. Here, impurity introduction is effected on the thin oxide film 2 for formation of a base region by using ion implantation techniques which utilizes the field oxide film 9 as part of the mask. Thereafter, anneal processing is carried out causing doped impurities to diffuse into the epi-growth Si layer 8 to thereby form a base region 7 therein.

Figure 3A:
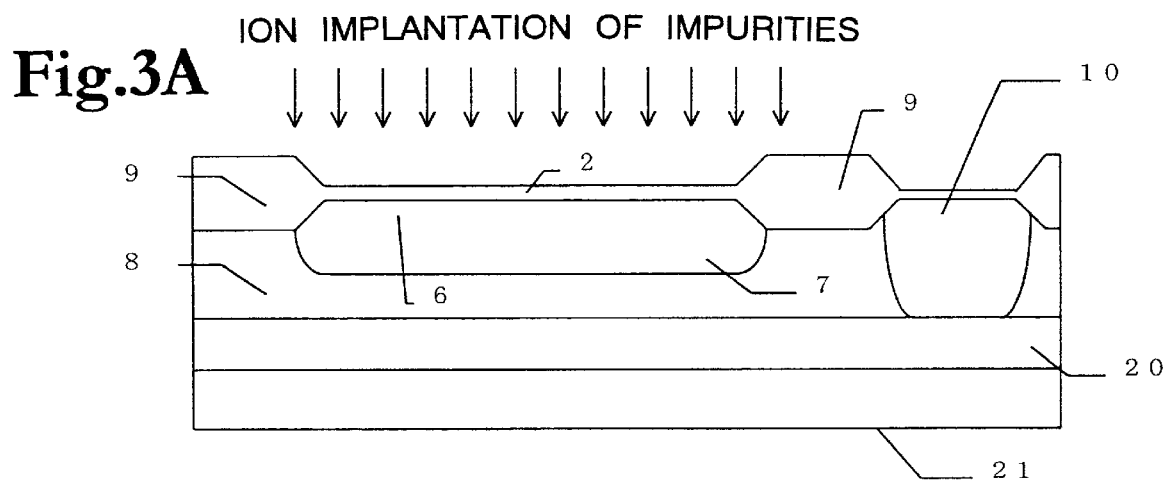
FIG. 3 is a process-sequential sectional diagram showing a manufacturing method of a bipolar transistor of the present invention.
Figure 3B:
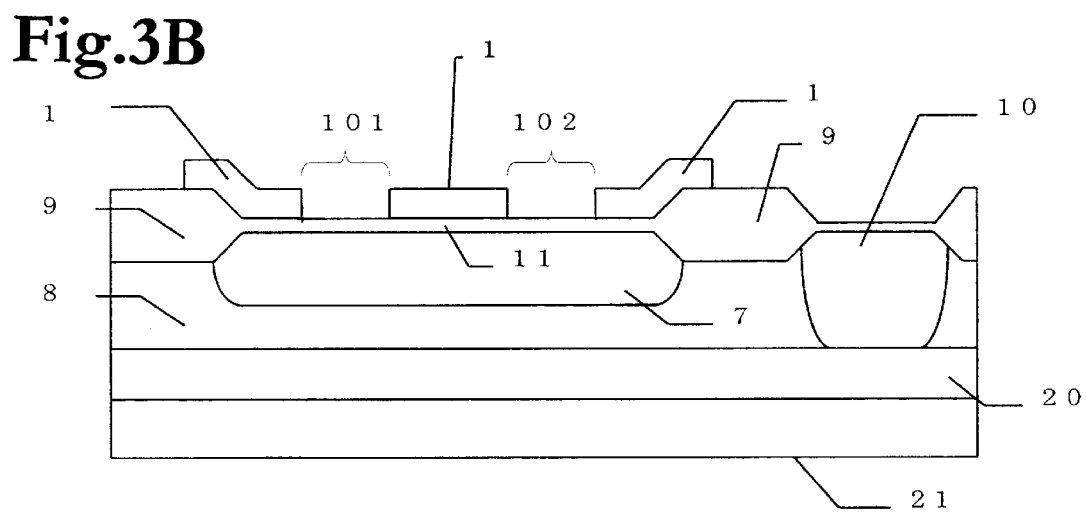

Next, as shown in FIG. 3B, a silicon oxide film 1 is formed after etching-removal of the thin oxide film 2, and the first polycrystalline silicon layer 1 is then deposited thereon. Thereafter, etching is effected to pattern the first polycrystalline silicon layer 1. Thereafter windowing is performed for formation of a first polycrystalline silicon emitter region window 102 and a first polycrystalline silicon base electrode window 101, which overlie the base region 7. Due to effectuation of this process, the resulting base region 7 is such that the first polycrystalline silicon layer 1 overlies and entirely covers the base region 7 other than the first polycrystalline silicon emitter region window 102 and first polycrystalline silicon base electrode window 101, wherein the significance of the first polycrystalline silicon layer 1 overlapping the silicon oxide film 11 is set by taking account of the thickness of the field oxide film 9 and any possible alignment deviation. For example, such is 0.5 to 1.5 ($\mu$m). More preferably, 0.5 to 1.0 ($\mu$m).

Figure 3C:
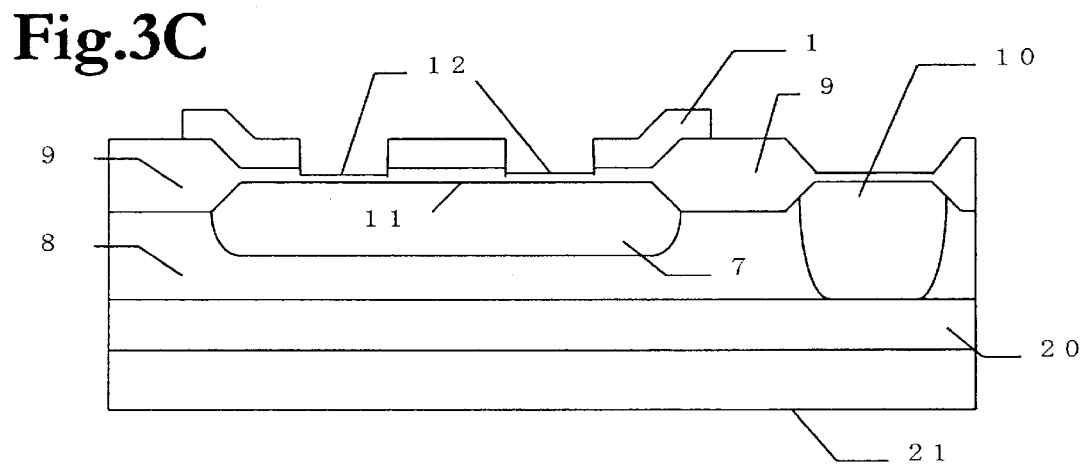

Next, as shown in FIG. 3C, partial removal of the silicon oxide film 11 of the first polycrystalline silicon emitter region window 102 and first polycrystalline silicon base electrode window 101 is conducted. By effecting this etching with the first polycrystalline silicon layer 1 as formed at the FIG. 3A step being used as a mask therefor, only those portions of the silicon oxide film overlying the Si layer of the window-opened sections 101, 102 are removed away. This process will no longer be required in cases where the thickness of such silicon oxide film is set enabling impurity ions (arsenide, for example) for use in forming the intended emitter region to sufficiently pass through or penetrate the silicon oxide film 11. The depiction shown in FIG. 1A is a final structure cross-sectional diagram when this process was not required.

Further, by thermal oxidation or CVD techniques a thin oxide film 12 is formed for use during ion implantation.

Figure 3D:
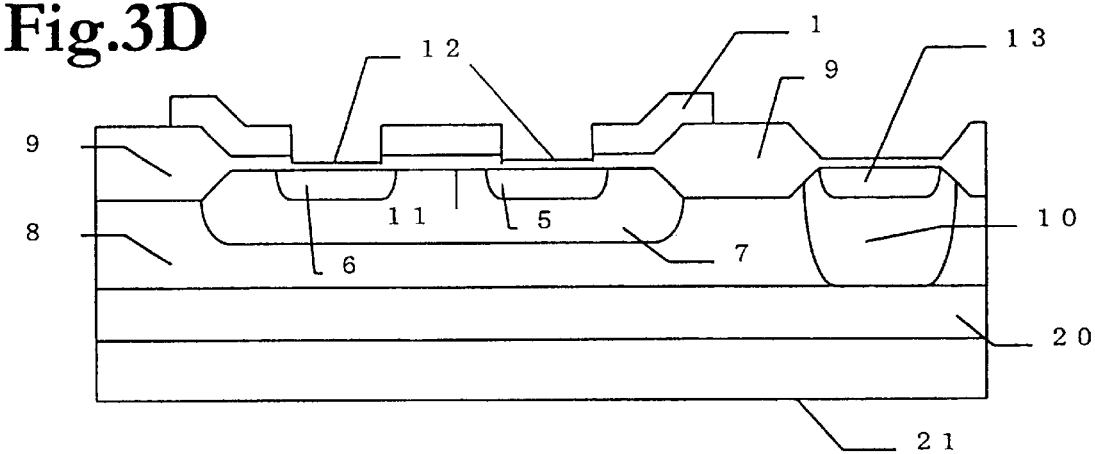

Next, at the step of FIG. 3D, arsenide atoms or phosphorus is injected or doped by ion implantation techniques with the first polycrystalline silicon layer 1 used as a mask to form the emitter region 5 and collector electrode 13. Subsequently, perform ion implantation of boron or $BF_2$ for fabrication of the base electrode region 6. It should be noted that where more than one insulated field effect transistor to be formed on the same substrate has the LDD structure, the manufacturing procedure must include certain process steps for ion implantation of lightly-doped regions and sidewall formation prior to the step of FIG. 3D.

Due to effectuation of the processes until here, it is possible to fabricate the base electrode and emitter region in a self-alignment fashion, which may in turn lead to the capability to stably manufacture the device having its accurately controlled performance even when the device is of miniaturized dimensions.

Figure 3E:
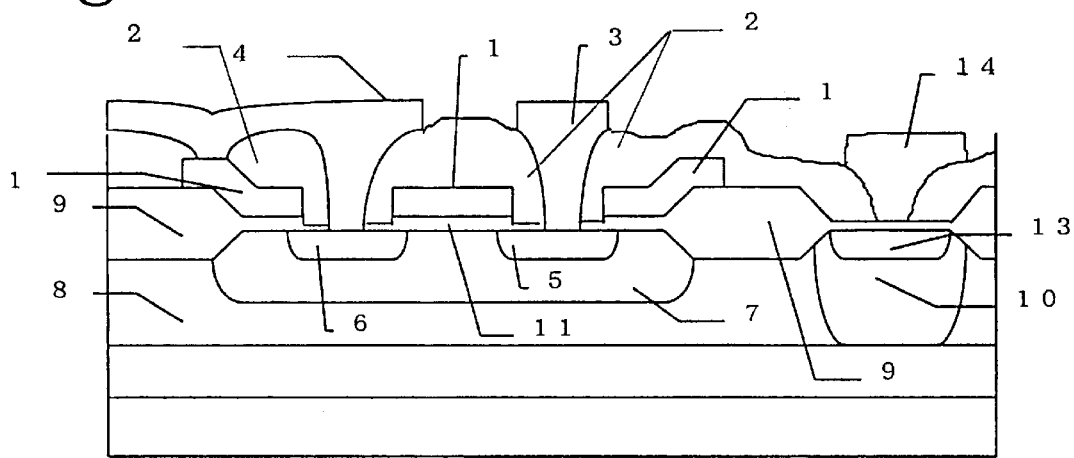

Next, as shown in FIG. 3E, the interlayer insulating film 2 made of BPSG, NSG, PSG or the like is deposited; thereafter, one or more contact holes are formed therein permitting attachment of a base metal electrode 4 and emitter metal electrode 3 as well as collector metal electrode 14. At this time the first polycrystalline silicon layer 1 is coupled via the base metal electrode 4 in order to let it be substantially the same in potential as the base electrode region 6. Preferably, a contact for coupling between the upper portion of first polycrystalline silicon layer 1 and the base metal electrode 4 is formed on the field oxide film 9.

With such contact formation, the resultant base region 7 has its upper surface which is fully covered at every part thereof by the first polycrystalline silicon layer 1 that is potentially stable, which makes it expectable to achieve further stable device characteristics.

Figure 4:
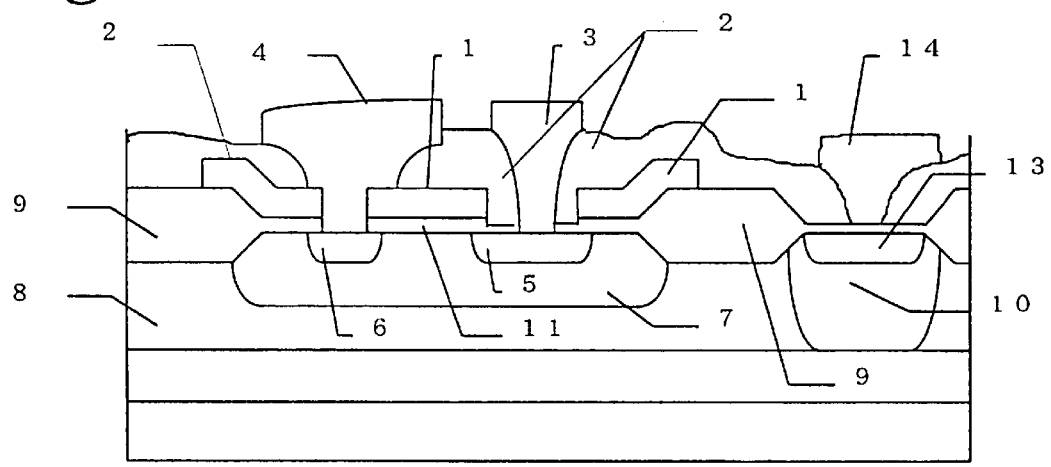
FIG. 4 is a sectional diagram of another embodiment of the bipolar transistor of the present invention.

FIG. 4 is a sectional diagram of a bipolar transistor in accordance with a second embodiment. Letting the size of a contact hole for connection between the base electrode region 6 and base metal electrode 4 be slightly greater than that of windowing on the base electrode region 6 of the first polycrystalline silicon layer 1 makes it possible to allow both the base electrode region 6 and the first polycrystalline silicon layer 1 to be connected to a metal electrode via a single contact hole. This in turn enables establishment of simultaneous electrical connection with less space required therefor; thus, it becomes possible to reduce or miniaturize an external base region which may lead to down-sizing of the device while at the same time improving the frequency characteristics and the like.

Additionally, FIG. 5 is a process-sequential cross-sectional diagram showing a manufacturing method of a bipolar transistor in accordance with a third embodiment. Since the steps depicted in FIG. 5A and FIG. 5B are the same as those shown in FIGS. 3(a)–3(b), a description thereof is omitted herein. Next, as shown in FIG. 5C, after effecting oxidation of the surface of the first polycrystalline silicon layer 1 through thermal oxidation, a CVD oxide film 15 is deposited. It is noted here that nitride film deposition may be carried out in succession. The CVD oxide film 15 and silicon oxide film 11 on or over the emitter Region are then removed.

Figure 5A:
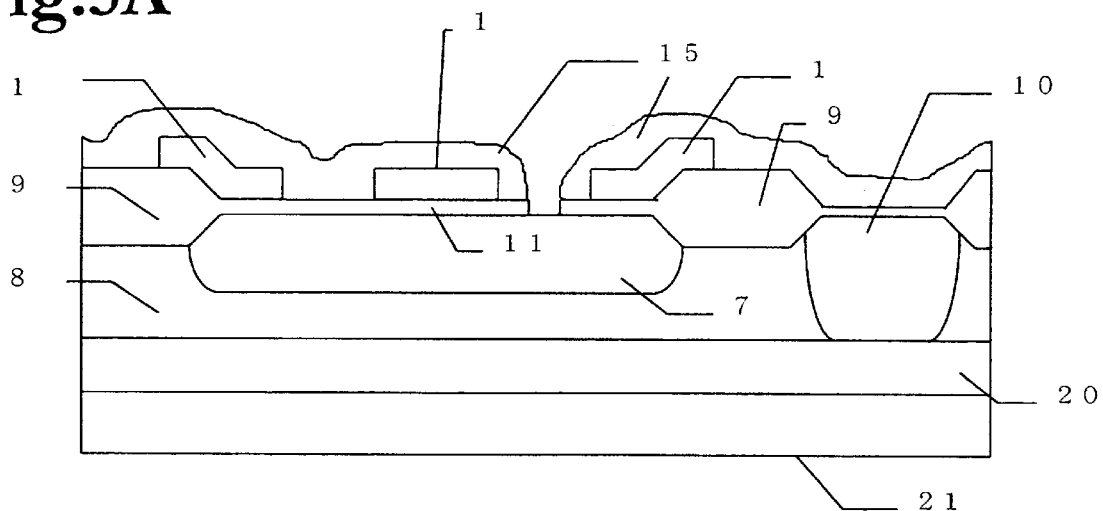
FIG. 5 is a process-sequential sectional diagram showing a manufacturing method of another embodiment of the bipolar transistor of the present invention.
Figure 5B:
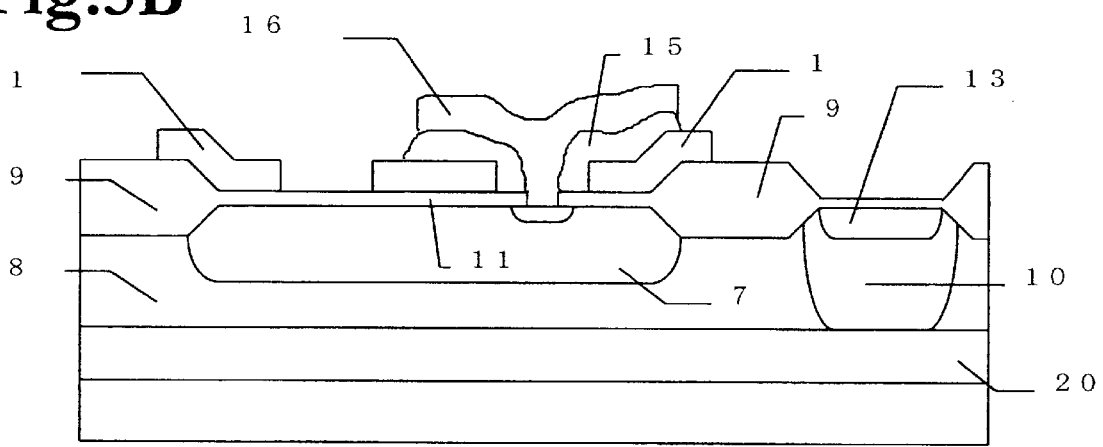
Figure 5C:
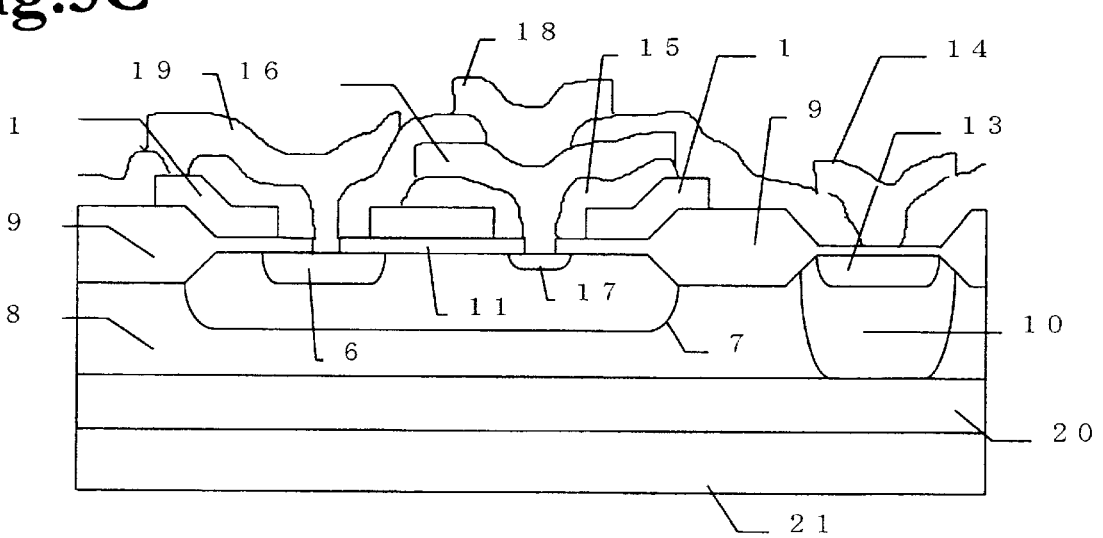
Figure 5D:
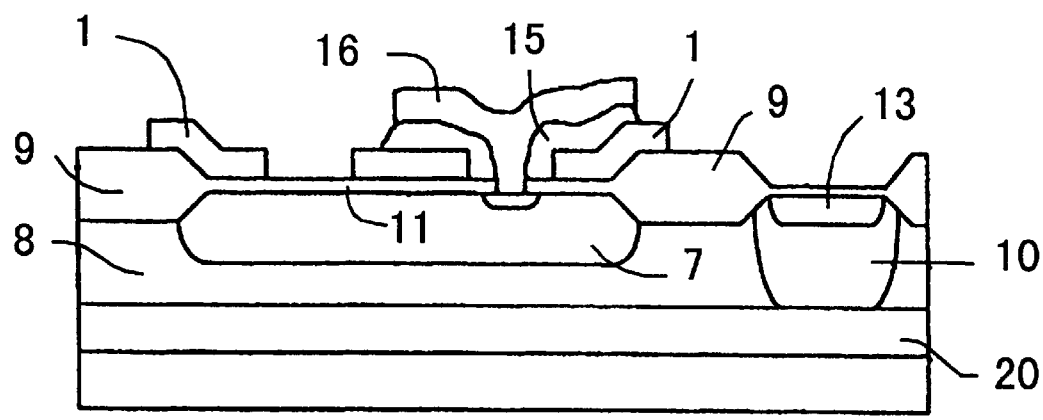
Figure 5E:
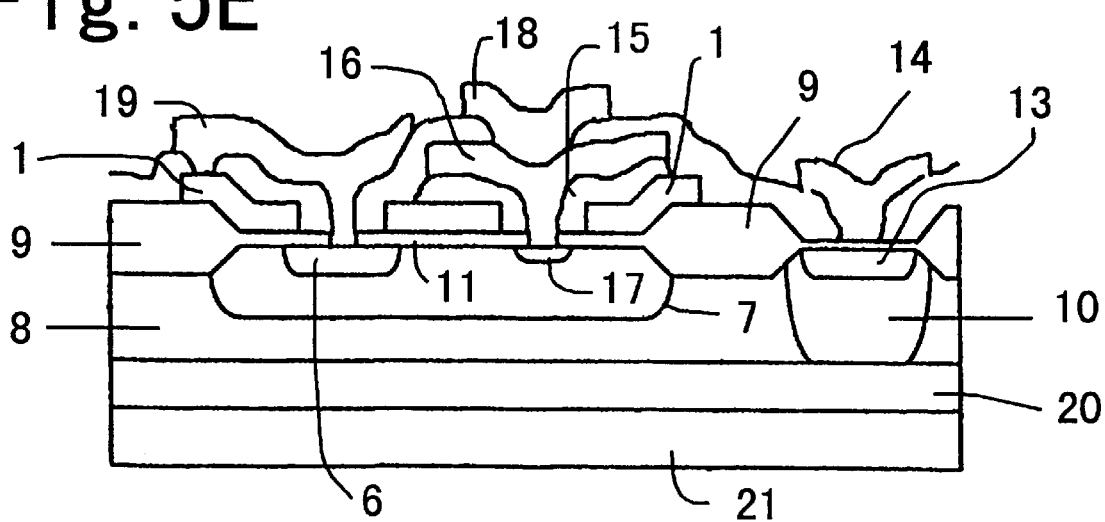

Next, as shown in FIG. 5(d), a second first polycrystalline silicon film is deposited. Thereafter, patterning is conducted to thereby form a polycrystalline silicon emitter 16. The film thickness of such second first polycrystalline silicon film is preferably 150 nm or less and, more preferably is within a range of from 80 nm to 120 nm. Next, are introduced impurities by ion implantation onto the polycrystalline silicon emitter 16 and a collector electrode formation region. Thereafter, diffusion processing is effected, thereby letting resultant impurities outdiffuse from the polycrystalline silicon emitter 16 layer into a silicon layer whereby a polycrystalline silicon emitter diffusion layer 17 is formed. Simultaneously, a collector electrode 13 is formed. Next, as shown in FIG. 5(e), a base electrode region 6, is formed An emitter metal electrode 18 and base metal electrode 19 plus collector metal electrode 14 are then formed.

It is noted in the third embodiment that the voltage potential of the first polycrystalline silicon layer 1 may alternatively be taken via the same contact hole as that for the base metal electrode as in the second embodiment stated supra.

Although the foregoing embodiments have been explained in conjunction with vertical type bipolars of NPN type, the present invention may also be used in PNP type bipolars.

As has been described above, this invention has its effect of enabling formation of a less-variation/stablecharacteristic bipolar transistor and BiCMOS on the same substrate without requiring addition of many complicated processes.

What is claimed is:

1. A bipolar transistor comprising: a semiconductor region of a first conductivity type; a collector region of the first conductivity type disposed within the semiconductor region; a base region of a second conductivity type disposed within a surface of the semiconductor region; an emitter region of the first conductivity type and a base electrode region of the second conductivity type disposed within a surface of the base region in self-alignment arrangement; and at least one polycrystalline silicon layer disposed on the entire surface of the base region except for portions of the surface of the base region overlying the emitter region and the base electrode region.

2. A bipolar transistor according to claim 1; further comprising a base metal electrode connected to the polycrystalline silicon layer.

3. A bipolar transistor according to claim 2; wherein the polycrystalline silicon layer and the base region are connected to the base metal electrode via a common contact hole.

4. A bipolar transistor comprising: a semiconductor region of a first conductivity type; a collector region of the first conductivity type disposed within the semiconductor region; a base region of a second conductivity type disposed within a surface of the semiconductor region; an emitter region of the first conductivity type and a base electrode region of the second conductivity type disposed within a surface of the base region in self-alignment arrangement; a first polycrystalline silicon layer disposed on the entire surface of the base region except for portions of the surface of the base region overlying the emitter region and the base electrode region; and a second polycrystalline silicon layer disposed over the first polycrystalline silicon layer.

5. A bipolar transistor according to claim 4; wherein the second polycrystalline silicon layer comprises a polycrystalline silicon resistive layer.

6. A bipolar transistor according to claim 4; wherein the second polycrystalline silicon layer has a thickness of 150 nm.

7. A bipolar transistor according to claim 4; further comprising a capacitive element having an oxide film and a nitride film and disposed between the first and second polycrystalline silicon layers.

8. A semiconductor integrated circuit device comprising: a substrate; a bipolar transistor disposed on the substrate and comprised of a semiconductor region of a first conductivity type, a collector region of the first conductivity type disposed within the semiconductor region, a base region of a second conductivity type disposed within a surface of the semiconductor region, an emitter region of the first conductivity type and a base electrode region of the second conductivity type disposed within a surface of the base region in self-alignment arrangement, and a polycrystalline silicon layer disposed on the entire surface of the base region except for portions of the surface of the base region overlying the emitter region and the base electrode region; and an insulated field effect transistor disposed on the substrate.

9. A semiconductor integrated circuit device according to claim 8; wherein the polycrystalline silicon layer of the bipolar transistor comprises a gate electrode of the insulated field effect transistor.

10. A semiconductor integrated circuit device according to claim 8; further comprising a base metal electrode connected to the polycrystalline silicon layer of the bipolar transistor.

11. A semiconductor integrated circuit device according to claim 10; wherein the polycrystalline silicon layer and the base region of the bipolar transistor are connected to the base metal electrode via a common contact hole.

12. A semiconductor integrated circuit device comprising: a substrate; a bipolar transistor disposed on the substrate and comprised of a semiconductor region of a first conductivity type, a collector region of the first conductivity type disposed within the semiconductor region, a base region of a second conductivity type disposed within a surface of the semiconductor region, an emitter region of the first conductivity type and a base electrode region of the second conductivity type disposed within a surface of the base region in self-alignment arrangement, a first polycrystalline. silicon layer disposed on the entire surface of the base region except for portions of the surface of the base region overlying the emitter region and the base electrode region, and a second polycrystalline silicon layer disposed over the first polycrystalline silicon layer; and an insulated field effect transistor disposed on the substrate.

13. A semiconductor integrated circuit device according to claim 12; wherein the second polycrystalline silicon layer of the bipolar transistor comprises a polycrystalline silicon resistive layer.

14. A semiconductor integrated circuit device according to claim 12; wherein the second polycrystalline silicon layer of the bipolar transistor has a thickness of 150 nm.

15. A bipolar transistor according to claim 12; further comprising a capacitive element having an oxide film and a nitride film and disposed between the first and second polycrystalline silicon layers of the bipolar transistor.

* * * * *